United States Patent
Baek et al.

(10) Patent No.: US 9,293,737 B2
(45) Date of Patent: Mar. 22, 2016

(54) ORGANIC LIGHT EMITTING DIODE DISPLAY

(71) Applicant: Samsung Display Co., Ltd., Yongin, Gyeonggi-do (KR)

(72) Inventors: Soo-Min Baek, Yongin (KR); Won-Sang Park, Yongin (KR); Min-Woo Kim, Yongin (KR); Il-Nam Kim, Yongin (KR); Jae-Kyoung Kim, Yongin (KR); Hae-Yun Choi, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/730,907

(22) Filed: Jun. 4, 2015

(65) Prior Publication Data

US 2015/0303407 A1    Oct. 22, 2015

Related U.S. Application Data

(62) Division of application No. 13/949,007, filed on Jul. 23, 2013, now Pat. No. 9,082,997.

(30) Foreign Application Priority Data

Mar. 20, 2013    (KR) .................. 10-2013-0029975

(51) Int. Cl.
*H01L 51/52*    (2006.01)
*H01L 27/32*    (2006.01)

(52) U.S. Cl.
CPC .......... *H01L 51/5281* (2013.01); *H01L 27/322* (2013.01); *H01L 27/3246* (2013.01); *H01L 27/3248* (2013.01); *H01L 27/3276* (2013.01); *H01L 51/5203* (2013.01); *H01L 51/5221* (2013.01); *H01L 51/5225* (2013.01); *H01L 51/5271* (2013.01); *H01L 51/5234* (2013.01); *H01L 51/5246* (2013.01); *H01L 2251/5315* (2013.01)

(58) Field of Classification Search
None
See application file for complete search history.

(56) References Cited

U.S. PATENT DOCUMENTS

| 6,828,726 | B2 * | 12/2004 | Sakurai ............... H01L 27/3246 313/498 |
|---|---|---|---|
| 2004/0160165 | A1 | 8/2004 | Yamauchi |
| 2005/0046342 | A1 | 3/2005 | Park et al. |
| 2006/0082295 | A1 * | 4/2006 | Chin ..................... H01L 27/322 313/506 |
| 2008/0150421 | A1 | 6/2008 | Takata |
| 2008/0197342 | A1 | 8/2008 | Lee et al. |
| 2010/0177124 | A1 | 7/2010 | Ryu et al. |

(Continued)

FOREIGN PATENT DOCUMENTS

| KR | 10-2010-0063292 A | 6/2010 |
|---|---|---|
| KR | 10-1060379 B | 8/2011 |

(Continued)

*Primary Examiner* — Khaja Ahmad
(74) *Attorney, Agent, or Firm* — Robert E. Bushnell, Esq.

(57) ABSTRACT

An organic light emitting diode (OLED) display includes a substrate, a light path guide layer formed on the substrate and having an inclined side wall, an organic light emitting diode (OLED) formed on the substrate and the light path guide layer, and a phase transition layer formed on the OLED and formed so as to correspond to the inclined side wall. Therefore, in the OLED display, the phase transition layer is formed in the light path guide layer so that it is possible to minimize external light reflectance increased by the light path guide layer.

5 Claims, 7 Drawing Sheets

(56) References Cited

U.S. PATENT DOCUMENTS

2011/0163330 A1 7/2011 Kim et al.
2013/0082988 A1 4/2013 Lee et al.
2013/0127786 A1 5/2013 Hong et al.

FOREIGN PATENT DOCUMENTS

KR 10-2011-0104318 A 9/2011
KR 10-2013-0007421 A 1/2013

* cited by examiner

ORGANIC LIGHT EMITTING DIODE DISPLAY

CROSS-REFERENCE TO RELATED APPLICATION AND CLAIM OF PRIORITY

This application makes reference to, incorporates into this specification the entire contents of, and claims all benefits accruing under 35 U.S.C. §119 from an application earlier filed in the Korean Intellectual Property Office on Mar. 20, 2013 and there duly assigned Ser. No. 10-2013-0029975. Furthermore, this application is filed pursuant to 35 U.S.C. §121 as a Divisional application of Applicant's patent application Ser. No. 13/949,007 filed in the U.S. Patent & Trademark Office on 23 Jul. 2013, and assigned to the assignee of the present invention. All benefits accruing under 35 U.S.C. §§120 and 121 from the aforesaid present application Ser. No. 13/949,007 are also claimed.

BACKGROUND OF THE INVENTION

1. Field of the Invention

The present invention relates to an organic light emitting diode (OLED) display capable of improving light efficiency and reducing eternal light reflectance.

2. Description of the Related Art

An organic light emitting diode (OLED) display includes organic light emitting elements, each consisting of an anode that is a hole injection electrode, an organic light emitting layer, and a cathode that is an electron injection electrode. Each of the organic light emitting elements emits light by energy generated when an exciton generated in the organic light emitting layer by combination of electrons and holes is reduced from an exited state to a ground state, and the OLED display displays a predetermined image using light emission.

Since light generated by the organic light emitting layer of the organic light emitting diode (OLED) display is partially or entirely reflected by a driving wiring line such as the anode, the cathode, or a thin film transistor (TFT), efficiency of light emitted to the outside is deteriorated. In order to solve the problem, a resonance structure in which thicknesses of organic layers are controlled so that constructive interference of light is generated to improve light efficiency is formed. In the organic light emitting diode (OLED) display having the resonance structure, light efficiency is improved, but visibility is deteriorated in accordance with a color shift on a side.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The present invention provides an organic light emitting diode (OLED) display capable of improving light efficiency and reducing external light reflectance.

An OLED display according to an exemplary embodiment of the invention may include a substrate, a light path guide layer formed on the substrate and having an inclined side wall, an organic light emitting diode (OLED) formed on the substrate and the light path guide layer, and a phase transition layer formed on the OLED so as to correspond to the inclined side wall.

The phase transition layer may include a phase transition film and a semi-transmissive film formed on the phase transition film.

The OLED may include a first electrode formed on the substrate and the light path guide layer, a pixel defining layer formed on the light path guide layer so as to cover an edge of the first electrode, an organic light emitting member formed on the first electrode, and a second electrode formed on the organic light emitting member.

The second electrode may include a second electrode side wall formed so as to correspond to the inclined side wall of the light path guide layer, and a phase transition layer may be formed on the second electrode side wall.

The phase transition layer may be inclined.

The first electrode may include a first electrode side wall formed on the inclined side wall of the light path guide layer, and the first electrode side wall may face the phase transition layer.

The first electrode may be a reflecting electrode.

The length of the phase transition layer may be smaller than that of the second electrode side wall.

In addition, an OLED display according to another exemplary embodiment of the invention may include a substrate, a light path guide layer formed on the substrate and having an inclined side wall, a phase transition layer formed on the inclined side wall of the light path guide layer, and an OLED formed on the substrate and the light path guide layer.

The phase transition layer may include a semi-transmissive film formed on the inclined side wall and a phase transition film formed on the semi-transmissive film.

The OLED may include a first electrode formed on the light path guide layer, a pixel defining layer formed on the light path guide layer so as to cover an edge of the first electrode, an organic light emitting member formed on the first electrode, and a second electrode formed on the organic light emitting member.

The phase transition layer may be inclined.

The second electrode may include a second electrode side wall formed so as to correspond to the inclined side wall of the light path guide layer and the second electrode side wall may face the phase transition layer.

The second electrode may be a reflecting electrode.

The length of the phase transition layer may be smaller than that of the inclined side wall.

In addition, an OLED display according to another exemplary embodiment of the invention may include a substrate, a driving wiring line formed on the substrate, a color filter formed on the driving wiring line, and an OLED formed on the color filter, and a phase transition layer may be formed under the driving wiring line.

The phase transition layer may include a phase transition film formed under the driving wiring line and a semi-transmissive film formed under the phase transition film.

The OLED display may further include a light path guide layer formed between the color filter and the OLED and having an inclined side wall, and the OLED may include a first electrode formed on the light path guide layer, a pixel defining layer formed on the light path guide layer so as to cover an edge of the first electrode, an organic light emitting member formed on the first electrode, and a second electrode formed on the organic light emitting member.

The second electrode may include a second electrode side wall formed on the light path guide layer, and the second electrode may be a reflecting electrode.

The driving wiring line may include a switching thin film transistor (TFT) and a driving TFT.

In the OLED display according to the exemplary embodiment of the invention, the light path guide layer having the inclined side wall is formed so that the light generated by the organic light emitting member is totally reflected so as to improve light efficiency.

In addition, the phase transition layer is formed in the light path guide layer so that it is possible to minimize external light reflectance increased by the light path guide layer.

In addition, in the rear surface light emitting type OLED display, the phase transition layer is formed under the driving wiring line so that it is possible to remove external light reflection caused by the driving wiring line.

In addition, in the rear surface light emitting type OLED display, since the phase transition layer is formed under the driving wiring line, since the resonance structured organic light emitting member and the color filter are formed so that the external light may be efficiently blocked, and since an additional polarizing plate for blocking the external light need not be used, it is possible to reduce manufacturing cost.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
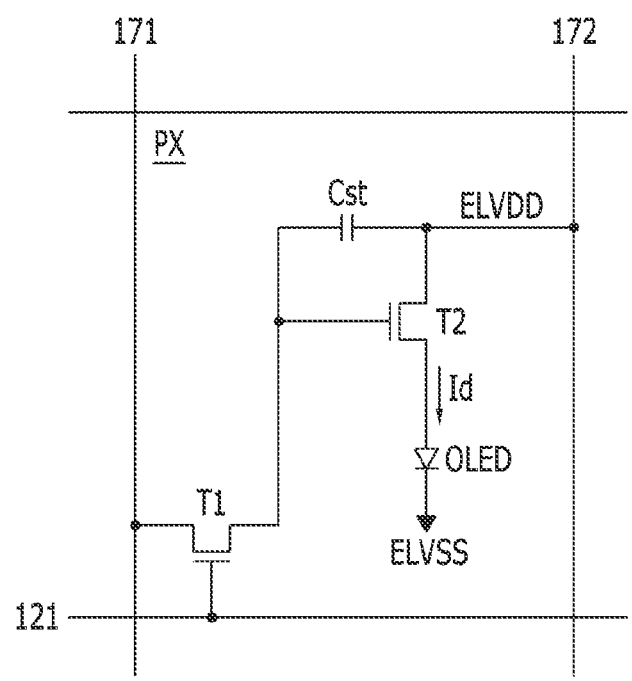
FIG. 1 is an equivalent circuit diagram of a pixel of an organic light emitting diode (OLED) display according to a first exemplary embodiment of the invention.

Hereinafter, the present invention will be described more fully with reference to the accompanying drawings, in which exemplary embodiments of the invention are shown. As those skilled in the art will realize, the described embodiments may be modified in various different ways, all without departing from the spirit or scope of the present invention.

In order to clarify the present invention, parts that are not related to the description are omitted. Throughout the specification, the same reference numerals designate the same or similar constituent elements.

In addition, since sizes and thicknesses of the constituent elements in the drawings are arbitrarily represented for better understanding and ease of description, the present invention is not necessarily limited thereto.

In the drawings, the thickness of layers, films, panels, regions, etc. are exaggerated for clarity. In the drawings, for better understanding and ease of description, thicknesses of partial layers and regions are exaggerated. It will be understood that, when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. In addition, throughout the specification, "on" means that a part is positioned on or under an object part, and does not necessarily mean that the part is positioned on the object part in a gravity direction.

In addition, in the accompanying drawings, a 2Tr 1Cap structured active matrix (AM) type organic light emitting diode (OLED) display in which a pixel includes two thin film transistors (TFT) and one capacitor is illustrated. However, the present invention is not limited thereto. Therefore, an OLED display may have various structures in which a pixel may include a plurality of TFTs and at least one capacitor, a wiring line may be further formed, and a conventional wiring line may be omitted. Here, a pixel refers to a minimum unit that displays an image and an OLED display displays an image through a plurality of pixels.

An OLED display according to a first exemplary embodiment will now be described in detail with reference to FIGS. 1 to 3.

FIG. 1 is an equivalent circuit diagram of a pixel of an OLED display according to a first exemplary embodiment of the invention.

As shown in FIG. 1, the OLED display according to the first exemplary embodiment includes a plurality of signal lines 121, 171, and 172 and a plurality of pixels PX connected to the signal lines 121, 171, and 172 and arranged in a matrix.

The signal lines include a plurality of scan lines 121 for transmitting scan signals (or gate signals), a plurality of data lines 171 for transmitting data signals, and a plurality of driving voltage lines 172 for transmitting a driving voltage ELVDD. The scan lines 121 run parallel with each other in a row direction and the data lines 171 and the driving voltage lines 172 run parallel with each other in a column direction. Each of the pixels PX includes a switching TFT T1, a driving TFT T2, a storage capacitor Cst, and an organic light emitting diode (OLED).

The switching TFT T1 includes a control terminal, an input terminal, and an output terminal. The control terminal is connected to the scan line 121, the input terminal is connected to the data line 171, and the output terminal is connected to the driving TFT T2. The switching TFT T1 transmits the data signal applied to the data line 171 to the driving TFT T2 in response to the scan signal applied to the scan line 121.

The driving TFT T2 also includes a control terminal, an input terminal, and an output terminal. The control terminal is connected to the switching TFT T1, the input terminal is connected to the driving voltage line 172, and the output terminal is connected to the OLED. The driving TFT T2 flows an output current Id, the magnitude of which varies with a voltage between the control terminal and the output terminal.

The storage capacitor Cst is connected between the control terminal and the input terminal of the driving TFT T2. The storage capacitor Cst charges the data signal applied to the control terminal of the driving TFT T2 and maintains the charged data signal after the switching TFT T1 is turned off.

The OLED includes a first electrode (an anode) connected to the output terminal of the driving TFT T2, a second electrode (a cathode) connected to a common voltage ELVSS, and an organic light emitting member formed between the first electrode and the second electrode. The OLED emits light with intensity that varies with the output current Id of the driving TFT T2 to display an image.

The switching TFT T1 and the driving TFT T2 may be n channel field effect transistors (FET) or p channel FETs. A connection relationship among the TFTs T1 and T2, the capacitor Cst, and the OLED may be changed.

A structure of the OLED display according to the first exemplary embodiment will nnow be described in detail with reference to FIGS. 2 and 3 together with above-described FIG. 1 based on the driving TFT T2.

Figure 2:
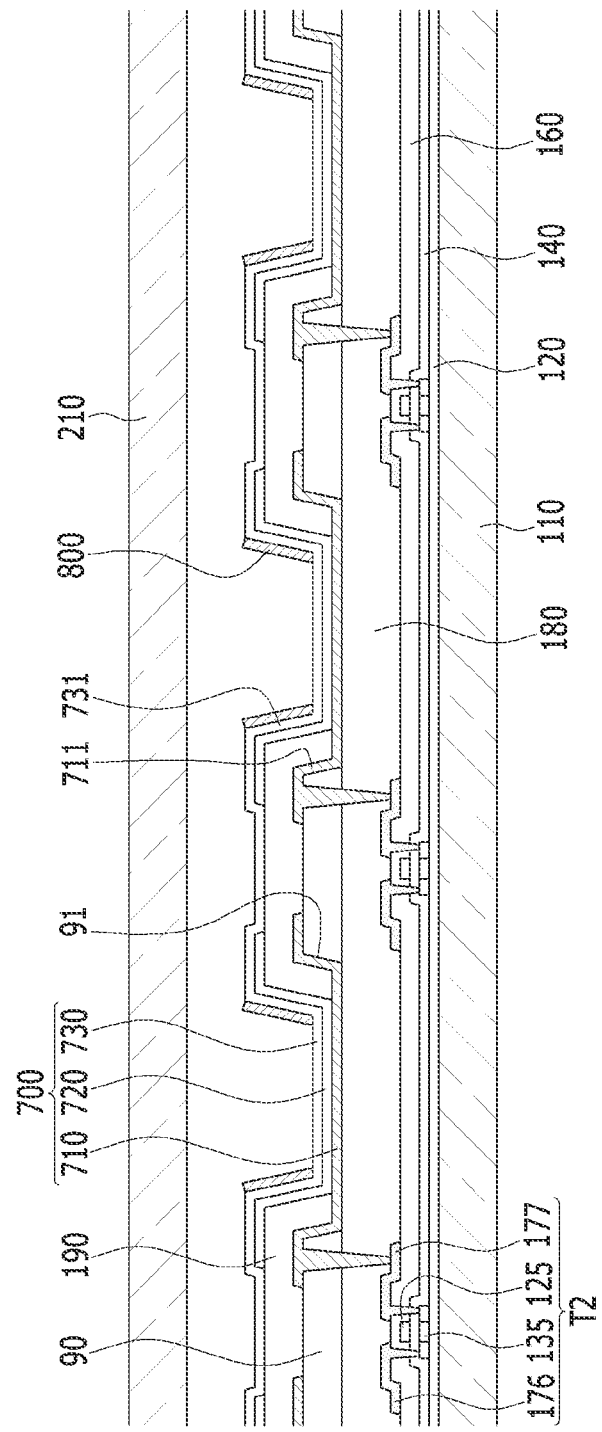
FIG. 2 is a cross-sectional view of the OLED display according to the first exemplary embodiment of the invention.
Figure 3:
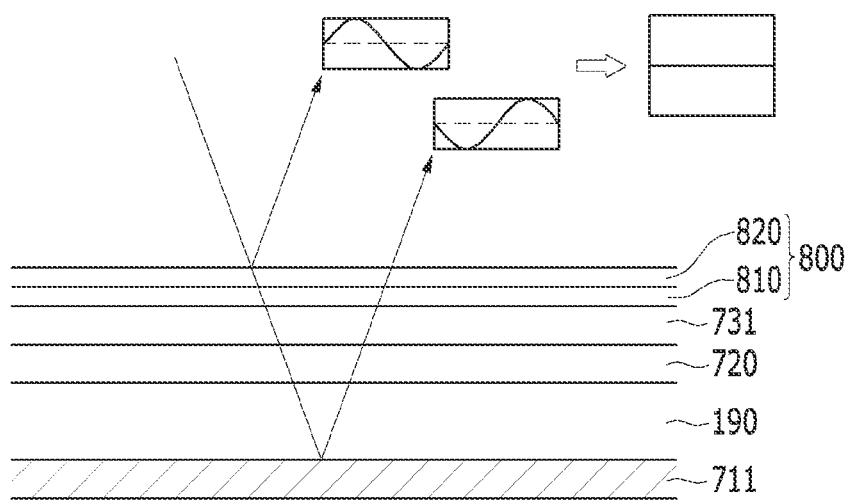
FIG. 3 is a view illustrating an external light offset operation of a phase transition layer of the OLED display according to the first exemplary embodiment of the invention.

FIG. 2 is a cross-sectional view of the OLED display according to the first exemplary embodiment of the invention, and FIG. 3 is a view illustrating an external light offset operation of a phase transition layer of the OLED display according to the first exemplary embodiment.

As shown in FIG. 2, in the OLED display according to the first exemplary embodiment, a buffer layer 120 is formed on a substrate 110. The substrate 110 may be an insulating substrate formed of glass, quartz, ceramic, or plastic, and the buffer layer 120 may be a single layer formed of silicon nitride (SiNx) or a double layer formed by laminating silicon nitride (SiNx) and silicon oxide ($SiO_2$). The buffer layer 120 prevents unnecessary components, such as impurities or moisture, from penetrating and planarizing a surface.

A driving semiconductor layer 135 is formed on the buffer layer 120. The driving semiconductor layer 135 may be formed of polysilicon or oxide semiconductor. The oxide semiconductor may include one of oxides based on titanium (Ti), hafnium (Hf), zirconium (Zr), aluminum (Al), tantalum (Ta), germanium (Ge), zinc (Zn), gallium (Ga), tin (Sn), and indium (In) and zinc oxide (ZnO), indium-gallium-zinc oxide ($InGaZnO_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide(In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O) that are composite oxides of titanium (Ti), hafnium (Hf), zirconium (Zr), aluminum (Al), tantalum (Ta), germanium (Ge), zinc (Zn), gallium (Ga), tin (Sn), and indium (In). When the semiconductor layer 135 is formed of an oxide semiconductor, a protective layer for protecting the oxide semiconductor vulnerable to an external environment such as high temperature may be added.

The driving semiconductor layer 135 includes a channel region that is not doped with impurities and a source region and a drain region that are doped with impurities on both sides of the channel region. Here, the impurities vary with the kind of TFT and may be N type impurities or P type impurities.

A gate insulating layer 140 is formed on the driving semiconductor layer 135. The gate insulating layer 140 may be a single layer or a plurality of layers including at least one of silicon nitride and silicon oxide.

A driving gate electrode 125 is formed on the gate insulating layer 140. An interlayer insulating layer 160 is formed on the driving gate electrode 125. The interlayer insulating layer 160 may be formed of silicon nitride or silicon oxide like the gate insulating layer 140.

A driving source electrode 176 and a driving drain electrode 177 are formed on the interlayer insulating layer 160. The driving source electrode 176 and the driving drain electrode 177 are connected to the driving semiconductor layer 135 through contact holes formed in the interlayer insulating layer 160 and the gate insulating layer 140.

As described above, the driving TFT T2 including the driving semiconductor layer 135, the driving gate electrode 125, the driving source electrode 176, and the driving drain electrode 177 is formed. A structure of the driving TFT T2 is not limited to the above-described example, but may have various well-known modifications that may be easily performed by those skilled in the art.

A light path guide layer 90 having inclined side walls 91 is formed on the protective layer 180. The light path guide layer 90 is divided into a plurality of layers by the inclined side walls 91 as boundaries, and the protective layer 180 is exposed through the parts in which the light path guide layer 90 is divided.

A first electrode 710 is formed on the exposed protective layer 180 and the light path guide layer 90. The first electrode 710 may be a reflecting electrode formed of a metal having high reflectance such as silver (Ag) or aluminum (Al) or an alloy of silver (Ag) and aluminum (Al). The first electrode 710 is electrically connected to the driving drain electrode 177 of the driving TFT T2 through the contact hole formed in the interlayer insulating layer 160. Most of the first electrode 710 is formed on the protective layer 180, and first electrode side walls 711 of the first electrode 710 are formed on the inclined side walls 91 of the light path guide layer 90. Since the first electrode side walls 711 are formed of reflecting electrodes to be inclined, it is possible to prevent light generated by an organic light emitting member 720 from leaking to a side, and to have light proceed to a front surface so that it is possible to improve light efficiency.

A pixel defining layer 190 that covers an edge of the first electrode 710 is formed on the light path guide layer 90, and the organic light emitting member 720 is formed on the first electrode 710 and the pixel defining layer 190. The pixel defining layer 190 may be formed of polyacrylates resin and polyimides resin or silica based inorganic material.

The organic light emitting member 720 may be formed of a multilayer including at least one of an organic light emitting layer, a hole injection layer (HIL), a hole transporting layer (HTL), an electron transporting layer (ETL), and an electron injection layer (EIL). When the organic light emitting member 720 includes all of the organic light emitting layer, the hole injection layer (HIL), the hole transporting layer (HTL), the electron transporting layer (ETL), and the electron injection layer (EIL), the hole injection layer (HIL) is disposed on the first electrode 710 that is an anode, and the hole transporting layer (HTL), the organic light emitting layer, the electron transporting layer (ETL), and the electron injection layer (EIL) are sequentially laminated on the hole injection layer (HIL).

The organic light emitting layer may include a red organic light emitting layer that emits red light, a green organic light emitting layer that emits green light, and a blue organic light emitting layer that emits blue light. The red organic light emitting layer, the green organic light emitting layer, and the blue organic light emitting layer may be formed in a red pixel, a green pixel, and a blue pixel, respectively, so as to realize a color image.

In addition, in the organic light emitting layer, the red organic light emitting layer, the green organic light emitting layer, and the blue organic light emitting layer may be laminated in the red pixel, the green pixel, and the blue pixel, respectively, and a red filter, a green filter, and a blue filter may be formed in the red pixel, the green pixel, and the blue pixel, respectively, so as to realize a color image. In another example, a white organic light emitting layer that emits white light may be formed in each of the red pixel, the green pixel, and the blue pixel, and the red filter, the green filter, and the blue filter may be formed in the red pixel, the green pixel, and the blue pixel, respectively, so as to realize a color image. When the color image is realized using the white organic light emitting layer and the color filters, then deposition masks for depositing the red organic light emitting layer, the green organic light emitting layer, and the blue organic light emitting layer on the red pixel, the green pixel, and the blue pixel, respectively, need not be used.

The white organic light emitting layer described in the other example may be formed of one organic light emitting layer and a plurality of organic light emitting layers may be laminated to emit white light. For example, at least one yellow organic light emitting layer and at least one blue organic light emitting layer may be combined with each other to emit white light, at least one cyan organic light emitting layer and at least one red organic light emitting layer may be combined with each other to emit white light, and at least one magenta organic emission layer and at least one green organic emission layer may be combined with each other to emit white light.

A second electrode 730 is formed on the organic light emitting member 720. The second electrode 730 may be formed of a transparent conductive oxide such as indium tin oxide (ITO) or indium zinc oxide (IZO) so as to transmit light. Therefore, since an organic light emitting diode (OLED) 700 including the first electrode 710, the organic light emitting member 720, and the second electrode 730 is formed, the first electrode 710 is formed of the reflecting electrode, and the second electrode 730 is formed of the transparent electrode, and a front surface light emitting type OLED display in which light proceeds to a front surface is formed.

In the second electrode 730, second electrode side walls 731 are formed to correspond to the inclined side walls 91 of the light path guide layer 90, and phase transition layers 800 are formed on entire regions of the second electrode side walls 731. Therefore, the phase transition layers 800 are inclined and the first electrode side walls 711 face the phase transition layers 800.

As shown in FIG. 3, the phase transition layer 800 includes a phase transition film 810 formed on the second electrode side wall 731 and a semi-transmissive film 820 formed on the phase transition film 810. The phase transition film 810 includes an inorganic thin film layer having a high refractive index, for example, Alq3 and ZnSe and the thickness and refractive index of the phase transition film 810 may be controlled so as to control a phase transition degree. The semi-transmissive film 820 includes an inorganic metal layer, for example, Mg:Ag.

External light is incident through the semi-transmissive film 820, partial light is reflected, and the remaining light is transmitted. The transmitted light is reflected by the first electrode side wall 711 that is the reflecting electrode so that a phase of the light is transited by the phase transition film 810 by 180 degrees. Therefore, since part of the external light reflected by the semi-transmissive film 820 and the remaining part of the external light that is reflected by the first electrode side wall 711 and whose phase is transited 180 degrees are offset interfered, the external light is extinguished, and reflectance of the external light is minimized.

A sealing member 210 (FIG. 2) for protecting the OLED 700 is formed on the second electrode 730, and the sealing member 210 is formed of a transparent material such as glass and plastic or a thin film encapsulation layer including a plurality of thin films. The thin film encapsulation layer may be formed by alternately laminating at least one organic layer and at least one inorganic layer.

The organic layer is formed of polymer, and may be a single layer or a laminated layer formed of one of polyethyeleneterepthalate (PET), polyimide, polycarbonate (PC), epoxy, polyethylene, and polyacrylate (PAR). The organic layer may be preferably formed of polyacrylate (PC). To be specific, the organic layer includes a polymerized monomer composition including diacrylate monomer and triacrylate monomer. The monomer composition may further include monoacrylate monomer. In addition, the monomer composition may further include a well-known photo-initiator such as TPO, but is not limited thereto.

The inorganic layer may be a single layer or a laminated layer including a metal oxide or a metal nitride. To be specific, the inorganic layer may include one of $SiN_x$, $Al_2O_3$, $SiO_2$, and $TiO_2$. In the thin film encapsulation layer, the uppermost layer exposed to the outside may be formed of the inorganic layer in order to prevent the organic light emitting element from being moist.

In addition, the thin film encapsulation layer may include at least one sandwich structure in which at least one organic layer is inserted between at least two inorganic layers. In addition, the thin film encapsulation layer may include at least one sandwich structure in which at least one inorganic layer is inserted between at least two organic layers.

On the other hand, according to the first exemplary embodiment, the phase transition layers are formed on the entire regions of the second electrode side walls. However, a second exemplary embodiment, in which the phase transition layers are formed only in partial regions of the second wide wall electrodes, is available.

Figure 4:
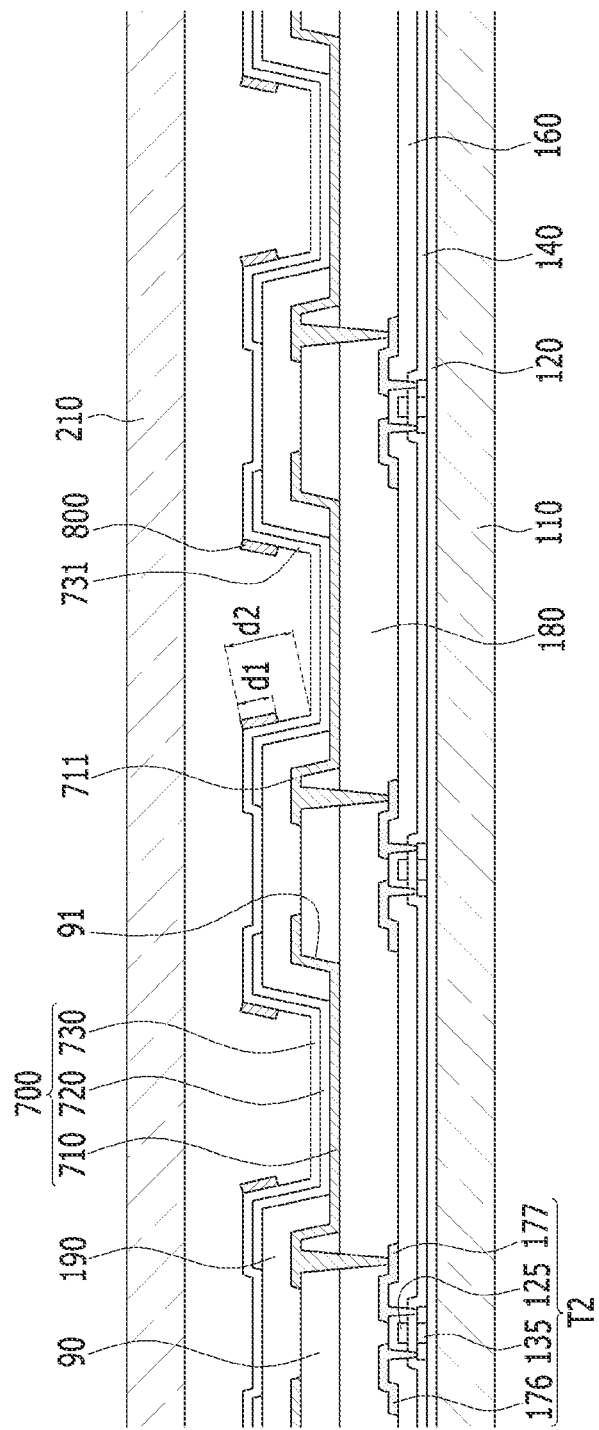
FIG. 4 is a cross-sectional view of an OLED display according to a second exemplary embodiment of the invention.

FIG. 4 is a cross-sectional view of an OLED display according to a second exemplary embodiment of the invention.

Since the second exemplary embodiment illustrated in FIG. 4 is substantially equivalent to the first exemplary embodiment illustrated in FIG. 2, excluding the structure of the phase transition layer, redundant description will be omitted.

As shown in FIG. 4, in the OLED display according to the second exemplary embodiment, the phase transition layers 800 are formed on partial regions of the second electrodes 731. That is, a length d1 of the phase transition layer 800 is formed so as to be smaller than a length d2 of the second electrode side wall 731. Therefore, in comparison to the first exemplary embodiment in which the phase transition layers 800 are formed on the entire regions of the second electrode side walls 731, light efficiency may be improved.

On the other hand, in the first exemplary embodiment, the phase transition layers are formed in a front surface light emitting type OLED display. However, a third exemplary embodiment, in which the phase transition layers are formed in a rear surface light emitting type OLED display, is available.

Figure 5:
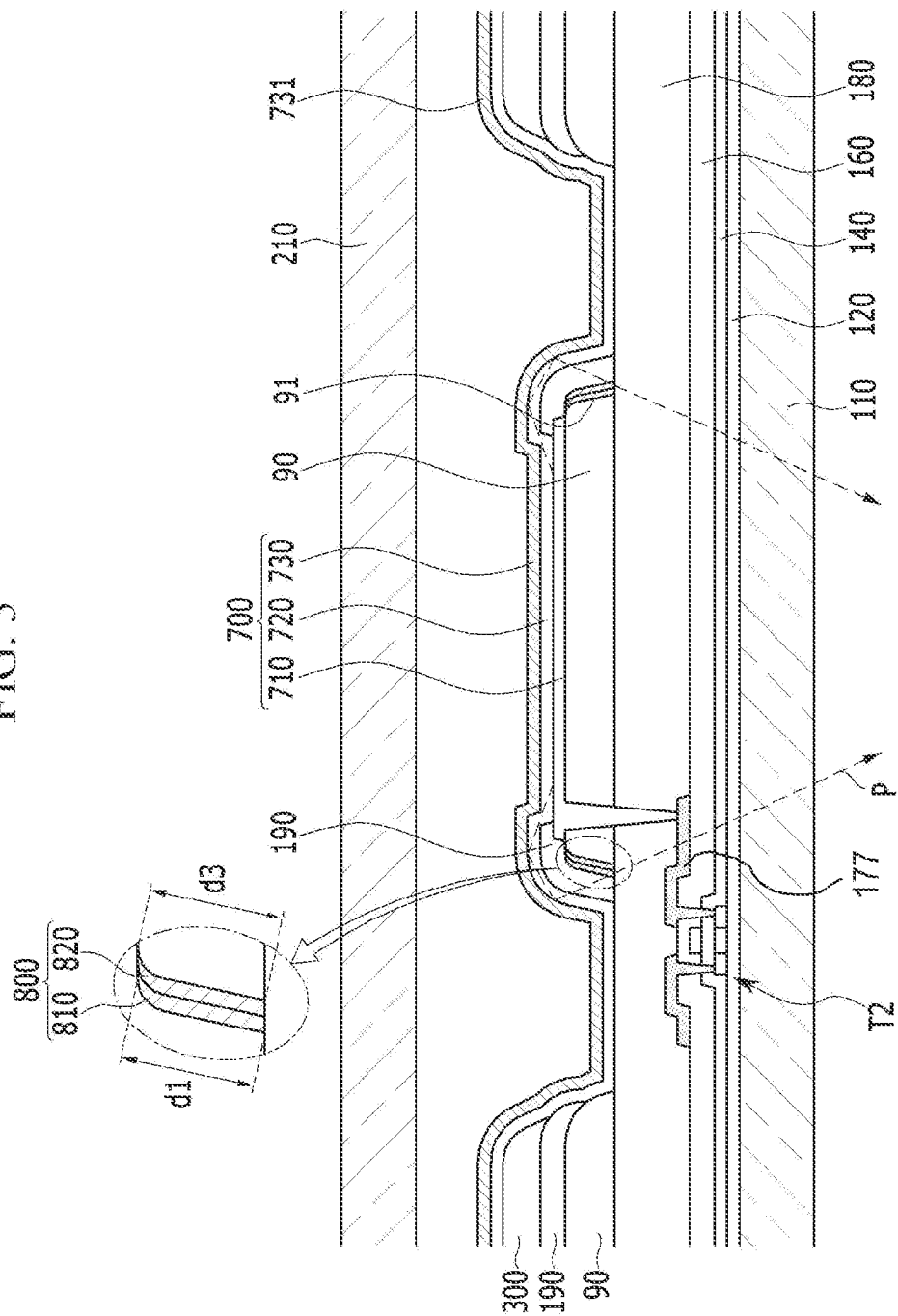
FIG. 5 is a cross-sectional view of an OLED display according to a third exemplary embodiment of the invention.

FIG. 5 is a cross-sectional view of an OLED display according to a third exemplary embodiment of the invention.

Since the third exemplary embodiment illustrated in FIG. 5 is substantially equivalent to the first exemplary embodiment illustrated in FIG. 2 excluding the positions of the phase transition layers, redundant description will be omitted.

As shown in FIG. 5, in the OLED display according to the third exemplary embodiment, the light path guide layer 90 having the inclined side walls 91 is formed on the protective layer 180. The light path guide layer 90 is divided into a plurality of layers by the inclined side walls 91 as boundaries, and the protective layer 180 is exposed through the parts in which the light path guide layer 90 is divided.

The first electrode 710 is formed on the light path guide layer 90. The first electrode 710 may be formed of a transparent conductive oxide such as indium tin oxide (ITO) or indium zinc oxide (IZO) so as to transmit light. The first electrode 710 is electrically connected to the driving drain electrode 177 of the driving TFT T2 through a contact hole formed in the light path guide layer 90 and the protection layer 180.

Since the phase transition layers 800 are formed on the inclined side walls 91 of the light path guide layer 90, the phase transition layers 800 are positioned so as to be inclined. The phase transition layers 800 may be formed on entire regions of the inclined side walls 91 and may be formed on partial regions of the inclined side walls 91 in order to improve light efficiency. That is, the length of the phase transition layers 800 may be formed so as to be smaller than a length d3 of the inclined side walls 91.

The phase transition layer 800 includes the semi-transmissive film 820 formed on the inclined side wall 91 and the phase transition film 810 formed on the semi-transmissive film 820.

The pixel defining layer 190 that covers the edge of the first electrode 710 is formed on the light path guide layer 90 and the phase transition layer 800, and a spacer 300 is formed on the pixel defining layer 190 in order to maintain a distance between the pixel defining layer 190 and the sealing member 210 for sealing up the OLED 700. The organic light emitting member 720 is formed on the first electrode 710, the pixel defining layer 190, and the spacer 300.

The second electrode 730 is formed on the organic light emitting member 720. The second electrode 730 may be a reflecting electrode formed of a metal having high reflectance such as silver (Ag) or aluminum (Al) or an alloy of silver (Ag) and aluminum (Al). Therefore, since the OLED 700 including the first electrode 710, the organic light emitting member 720, and the second electrode 730 is formed, the first electrode 710 is formed of the transparent electrode, and the second electrode 730 is formed of the reflecting electrode, a rear surface light emitting type OLED display in which light proceeds to a rear surface is formed.

Since the second electrode side walls 731 are formed of reflecting electrodes to be inclined, it is possible to prevent light P generated by the organic light emitting member 720 from leaking to a side and to have light proceed to a front surface so that it is possible to improve light efficiency.

Since the second electrode side walls 731 face the phase transition layers 800 and the OLED display is in a rear surface light emitting type, external light is incident from a rear surface through the semi-transmissive film 820 and partial light is reflected and the remaining light is transmitted. The transmitted light is reflected by the second electrode side wall 731 that is the reflecting electrode so that a phase of the light is transited by the phase transition film 810 by 180 degrees. Therefore, since part of the external light reflected by the semi-transmissive film 820 and the remaining part of the external light that is reflected by the second electrode side wall 731, and the phase of which is transited by 180 degrees, are offset interfered, the external light is extinguished, and reflectance of the external light is minimized.

The sealing member 210 for protecting the OLED 700 is formed on the second electrode 730, and the sealing member 210 is formed of a transparent material, such as glass and plastic, or a thin film encapsulation layer including a plurality of thin films.

On the other hand, in the third exemplary embodiment, in the rear surface light emitting type OLED) display, the phase transition layers 800 are formed on the inclined side walls of the light path guide layer 90. However, a fourth exemplary embodiment in which the phase transition layer 800 is formed under a driving wiring line in the rear surface light emitting type OLED display is available.

Figure 6:
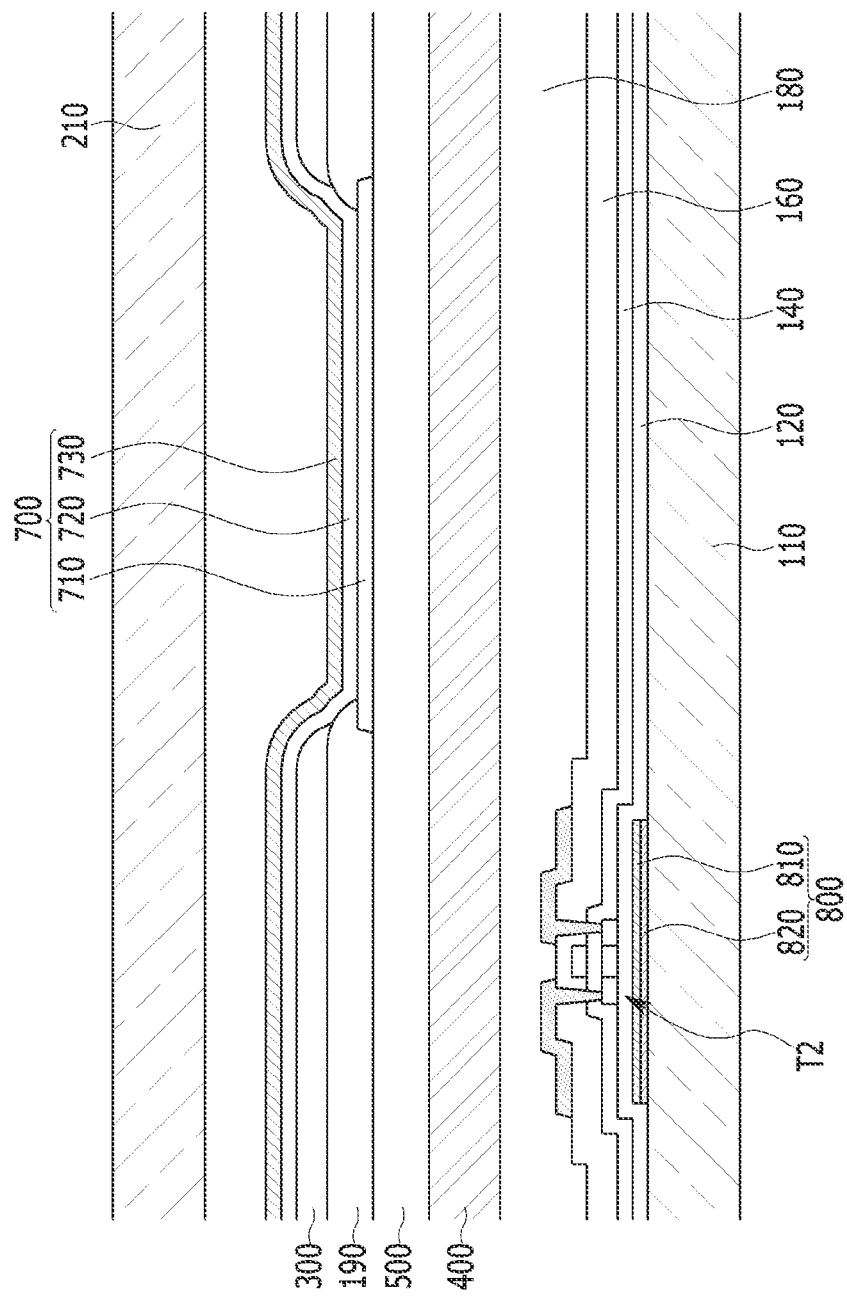
FIG. 6 is a cross-sectional view of an OLED display according to a fourth exemplary embodiment of the invention.

FIG. 6 is a cross-sectional view of an OLED display according to a fourth exemplary embodiment of the invention.

Since the fourth exemplary embodiment illustrated in FIG. 6 is substantially equivalent to the third exemplary embodiment illustrated in FIG. 5, excluding the fact that the light path guide layer does not exist and the phase transition layer is formed under the driving wiring line, redundant description will be omitted.

As shown in FIG. 6, in the OLED display according to the fourth exemplary embodiment, the phase transition layer 800 is formed between the driving wiring line, such as the driving TFT T2, and a switching TFT (not shown) and a substrate 110. The phase transition layer 800 includes the phase transition film 810 formed under the driving wiring line T2 and the semi-transmissive film 820 formed under the phase transition film 810.

Since the OLED display is a rear surface light emitting type, external light is incident from the rear surface through the semi-transmissive film 820, and partial light is reflected and the remaining light is transmitted. The transmitted light is reflected by the driving wiring line T2 formed of a reflecting material so that a phase of the light is transited by the phase transition film 810 by 180 degrees. Therefore, since part of the external light reflected by the semi-transmissive film 820 and the remaining part of the external light that is reflected by the driving wiring line T2, the phase of which is transited by 180 degrees, are offset interfered, the external light is extinguished and reflectance of the external light is minimized.

On the other hand, a color filter 400 is formed on the protective layer 180, and a cover layer 500 for protecting the color filter 400 is formed on the color filter 400.

The first electrode 710 is formed on the cover layer 500. The first electrode 710 may be formed of a transparent conductive oxide, such as ITO or IZO, so as to transmit light.

The pixel defining layer 190 that covers the edge of the first electrode 710 is formed on the cover layer 500, and the spacer 300 is formed on the pixel defining layer 190 in order to maintain a distance between the pixel defining layer 190 and the sealing member 210 for sealing up the OLED 700. The organic light emitting member 720 is formed on the first electrode 710, the pixel defining layer 190, and the spacer 300. The second electrode 730 is formed on the organic light emitting member 720 and the spacer 300. Therefore, the OLED 700 including the first electrode 710, the organic light emitting member 720, and the second electrode 730 is formed.

Since the organic light emitting member 720 may be formed of a multilayer including at least one of the organic light emitting layer, the hole injection layer (HIL), the hole transporting layer (HTL), the electron transporting layer (ETL), and the electron injection layer (EIL), thicknesses and materials of the organic light emitting layer, the hole injection layer (HIL), the hole transporting layer (HTL), the electron transporting layer (ETL), and the electron injection layer (EIL) may be controlled so that the organic light emitting member 720 has a resonance structure. The organic light emitting member 720, formed to have the resonance structure, absorbs a wavelength of light emitted thereby.

Since the organic light emitting member 720 is formed to have the resonance structure, and the color filter 400 of the same color as that of the light emitted by the organic light emitting member 720 is formed so that, in the external light incident from the outside, only the light of the same color as that of the color filter 400 passes through the color filter 400 and the transmitted light is absorbed by the resonance structured organic light emitting member 720, the external light is extinguished. For example, since, in the external light that passes through a blue filter, only the light of a blue wavelength is transmitted so as to be incident on the organic light emitting member, and a blue organic light emitting member absorbs the light of the blue wavelength, the external light is extinguished.

As described above, since, in the rear surface light emitting type OLED display, the phase transition layer 800 is formed under the driving wiring line and the resonance structured organic light emitting member 720 and the color filter 400 are formed so that the external light may be efficiently blocked and an additional polarizing plate for blocking the external light needs not to be used, it is possible to reduce manufacturing cost.

On the other hand, in the fourth exemplary embodiment, in the rear surface light emitting type OLED display, the light path guide layer is not formed. However, a fifth exemplary embodiment, in which the light path guide layer and the phase transition layer are formed in the rear surface light emitting type OLED display, is available.

Figure 7:
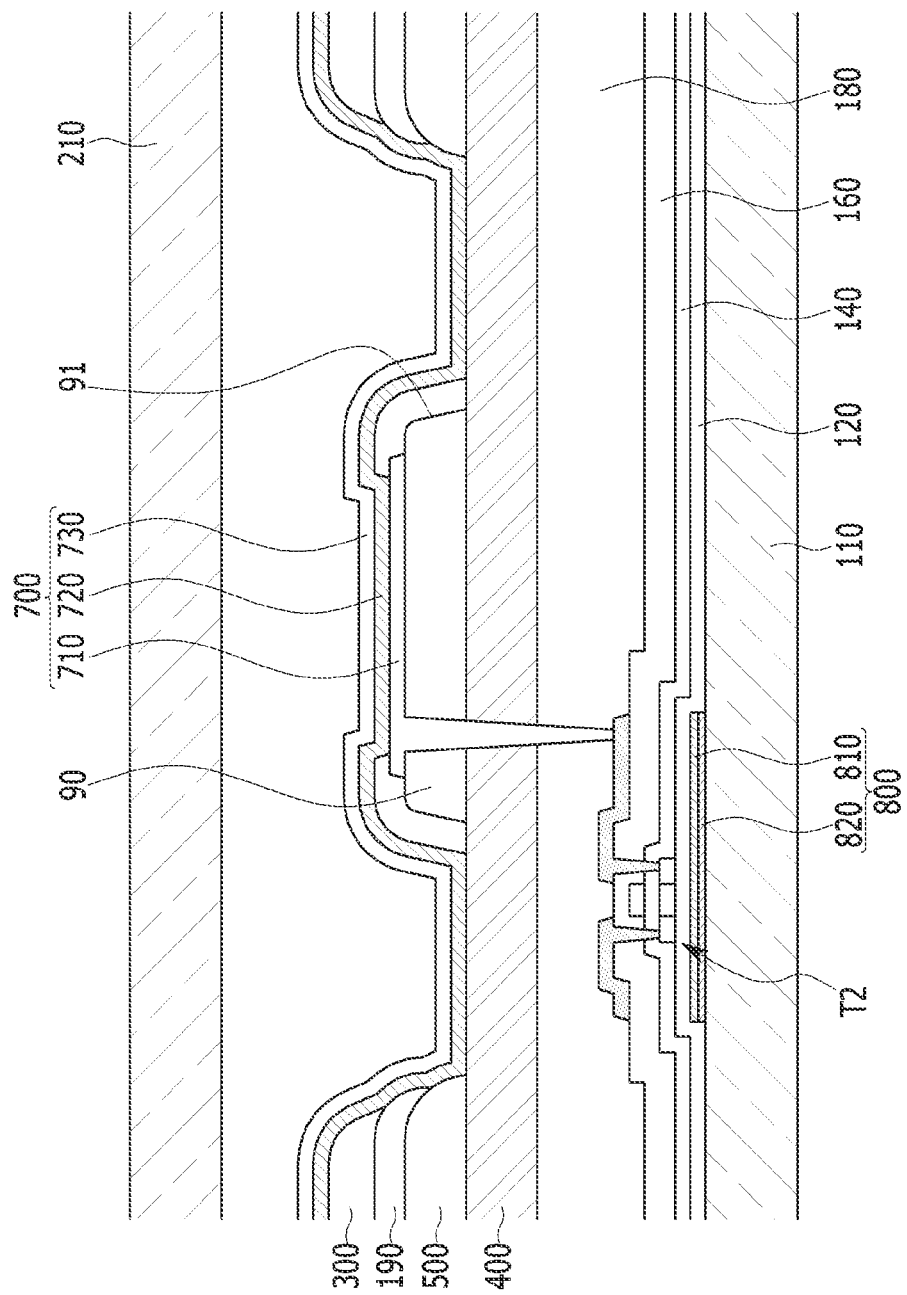
FIG. 7 is a cross-sectional view of an OLED display according to a fifth exemplary embodiment of the invention.

FIG. 7 is a cross-sectional view of an OLED display according to a fifth exemplary embodiment of the invention.

Since the fifth exemplary embodiment illustrated in FIG. 7 is substantially equivalent to the fourth exemplary embodiment illustrated in FIG. 6, excluding the fact that the light path guide layer is formed, redundant description will be omitted.

As shown in FIG. 7, in the OLED display according to the fifth exemplary embodiment, the phase transition layer 800 is formed between the driving wiring line, such as the driving TFT T2, and the switching TFT (not shown) and the substrate 110. The phase transition layer 800 includes the phase transition film 810 formed under the driving wiring line T2 and the semi-transmissive film 820 formed under the phase transition film 810.

Since the OLED display is a rear surface light emitting type, external light is incident from the rear surface through the semi-transmissive film 820, and partial light is reflected and the remaining light is transmitted. The transmitted light is reflected by the driving wiring line T2 formed of a reflecting material so that a phase of the light is transited by the phase transition film 810 by 180 degrees. Therefore, since part of the external light reflected by the semi-transmissive film 820 and the remaining part of the external light that is reflected by the driving wiring line T2, the phase of which is transited by 180 degrees, are offset interfered, the external light is extinguished and reflectance of the external light is minimized.

On the other hand, the color filter 400 is formed on the protective layer 180, and the cover layer 500 for protecting the color filter 400 is formed on the color filter 400. The light path guide layer 90 having the inclined side walls 91 is formed on the cover layer 500. The first electrode 710 is formed on the light path guide layer 90. The first electrode 710 may be formed of a transparent conductive oxide, such as ITO or IZO, to transmit light. The first electrode 710 is electrically connected to the driving drain electrode 177 of the driving TFT T2 through the contact hole formed in the interlayer insulating layer 160.

The pixel defining layer 190 that covers the edge of the first electrode 710 is formed on the light path guide layer 90 and the phase transition layer 800, and the spacer 300 is formed on the pixel defining layer 190 in order to maintain a distance between the pixel defining layer 190 and the sealing member 210 for sealing up the OLED 700. The organic light emitting member 720 is formed on the first electrode 710, the pixel defining layer 190, and the spacer 300.

The second electrode 730 is formed on the organic light emitting member 720. The second electrode 730 may be a reflecting electrode formed of a metal having high reflectance, such as silver (Ag) or aluminum (Al) or an alloy of silver (Ag) and aluminum (Al). Therefore, the OLED 700, including the first electrode 710, the organic light emitting member 720, and the second electrode 730, is formed, the first electrode 710 is formed of the transparent electrode, and the second electrode 730 is formed of the reflecting electrode, and the rear surface light emitting type OLED display in which light proceeds to the rear surface is formed.

Since the second electrode side walls 731 are formed of reflecting electrodes so as to be inclined, it is possible to prevent light P generated by the organic light emitting member 720 from leaking to a side, and to have light proceed to a front surface, so that it is possible to improve light efficiency.

Since the organic light emitting member 720 may be formed of a multilayer including at least one of the organic light emitting layer, the hole injection layer (HIL), the hole transporting layer (HTL), the electron transporting layer (ETL), and the electron injection layer (EIL), the thicknesses and materials of the organic light emitting layer, the hole injection layer (HIL), the hole transporting layer (HTL), the electron transporting layer (ETL), and the electron injection layer (EIL) may be controlled so that the organic light emitting member 720 has a resonance structure. The organic light emitting member 720 formed to have the resonance structure absorbs the wavelength of the light emitted thereby.

Since the organic light emitting member 720 is formed to have the resonance structure, and the color filter 400 of the same color as that of the light emitted by the organic light emitting member 720 is formed so that, in the external light incident from the outside, only the light of the same color as that of the color filter 400 passes through the color filter 400 and the transmitted light is absorbed by the resonance structured organic light emitting member 720, the external light is extinguished. For example, since, in the external light that passes through the blue filter, only the light of the blue wavelength is transmitted so as to be incident on the organic light emitting member and the blue organic light emitting member absorbs the light of the blue wavelength, the external light is extinguished.

As described above, since, in the rear surface light emitting type OLED display, the phase transition layer 800 is formed under the driving wiring line, and the resonance structured organic light emitting member 720 and the color filter 400 are formed so that the external light may be efficiently blocked, and since the additional polarizing plate for blocking the external light need not be used, it is possible to reduce manufacturing cost.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display, comprising:
    a substrate;
    a driving circuit with driving wiring line formed on the substrate;
    a color filter formed on the driving wiring line;
    an OLED formed on the color filter; and
    a phase transition layer formed under the circuit, over the substrate,
    wherein the phase transition layer comprises a semi-transmissive film and a phase transition film so that a portion of an external light transmitted by the semi-transmissive film is reflected by the driving wiring line and is transited by the phase transition film by 180 degrees to minimize the reflectance of the external light.

2. The OLED display of claim 1, wherein the phase transition film formed under the driving wiring line and the semi-transmissive film formed under the phase transition film.

3. The OLED display of claim 2, further comprising a light path guide layer formed between the color filter and the OLED, and having an inclined side wall;
    wherein the OLED comprises:
    a first electrode formed on the light path guide layer;
    a pixel defining layer formed on the light path guide layer so as to cover an edge of the first electrode;
    an organic light emitting member formed on the first electrode; and
    a second electrode formed on the organic light emitting member.

4. The OLED display of claim 3, wherein the second electrode comprises a second electrode side wall formed on the light path guide layer; and
    wherein the second electrode is a reflecting electrode.

5. The OLED display of claim 4, wherein the driving circuit comprises a switching thin film transistor (TFT) and a driving TFT.

* * * * *